US006388736B1

(12) United States Patent
Smith et al.

(10) Patent No.: US 6,388,736 B1
(45) Date of Patent: May 14, 2002

(54) IMAGING METHOD USING PHASE BOUNDARY MASKING WITH MODIFIED ILLUMINATION

(75) Inventors: Bruce W. Smith, Webster, NY (US); John S. Petersen, Austin, TX (US)

(73) Assignee: ASM Lithography B.V., Veldhoven (NL)

( * ) Notice: Subject to any disclaimer, the term of this patent is extended or adjusted under 35 U.S.C. 154(b) by 0 days.

(21) Appl. No.: 09/713,721

(22) Filed: Nov. 15, 2000

Related U.S. Application Data

(60) Provisional application No. 60/165,465, filed on Nov. 15, 1999.

(51) Int. Cl.[7] ........................ G03B 27/42; G03B 27/52; G03F 9/00; G03L 5/00; A61N 5/00
(52) U.S. Cl. .............................. 355/53; 355/55; 355/67; 355/71; 355/77; 430/4; 430/5; 430/311; 430/312; 250/492.2; 250/492.22
(58) Field of Search ...................... 355/53, 55, 67, 355/71, 77; 430/4, 5, 311, 312; 250/492.2, 492.22

(56) References Cited

U.S. PATENT DOCUMENTS

| 5,638,211 A | | 6/1997 | Shiraishi | |
|---|---|---|---|---|
| 5,673,102 A | | 9/1997 | Suzuki et al. | |
| 5,851,701 A | * | 12/1998 | Rolson | 430/5 |
| 5,888,678 A | * | 3/1999 | Tzu et al. | 430/5 |
| 5,922,513 A | * | 7/1999 | Jeon et al. | 430/311 |
| 6,150,058 A | * | 11/2000 | Tu et al. | 430/5 |

* cited by examiner

*Primary Examiner*—Russell Adams
*Assistant Examiner*—Khaled Brown
(74) *Attorney, Agent, or Firm*—Pillsbury Winthrop LLP

(57) ABSTRACT

A projection lithography system provides a cross-quadrupole illumination pattern in combination with a translucent substrate having boundary relief features. The features are spaced close together so that they are not imaged in a focal plane, but generate a dark image of the space between the features in the focal plane.

51 Claims, 17 Drawing Sheets

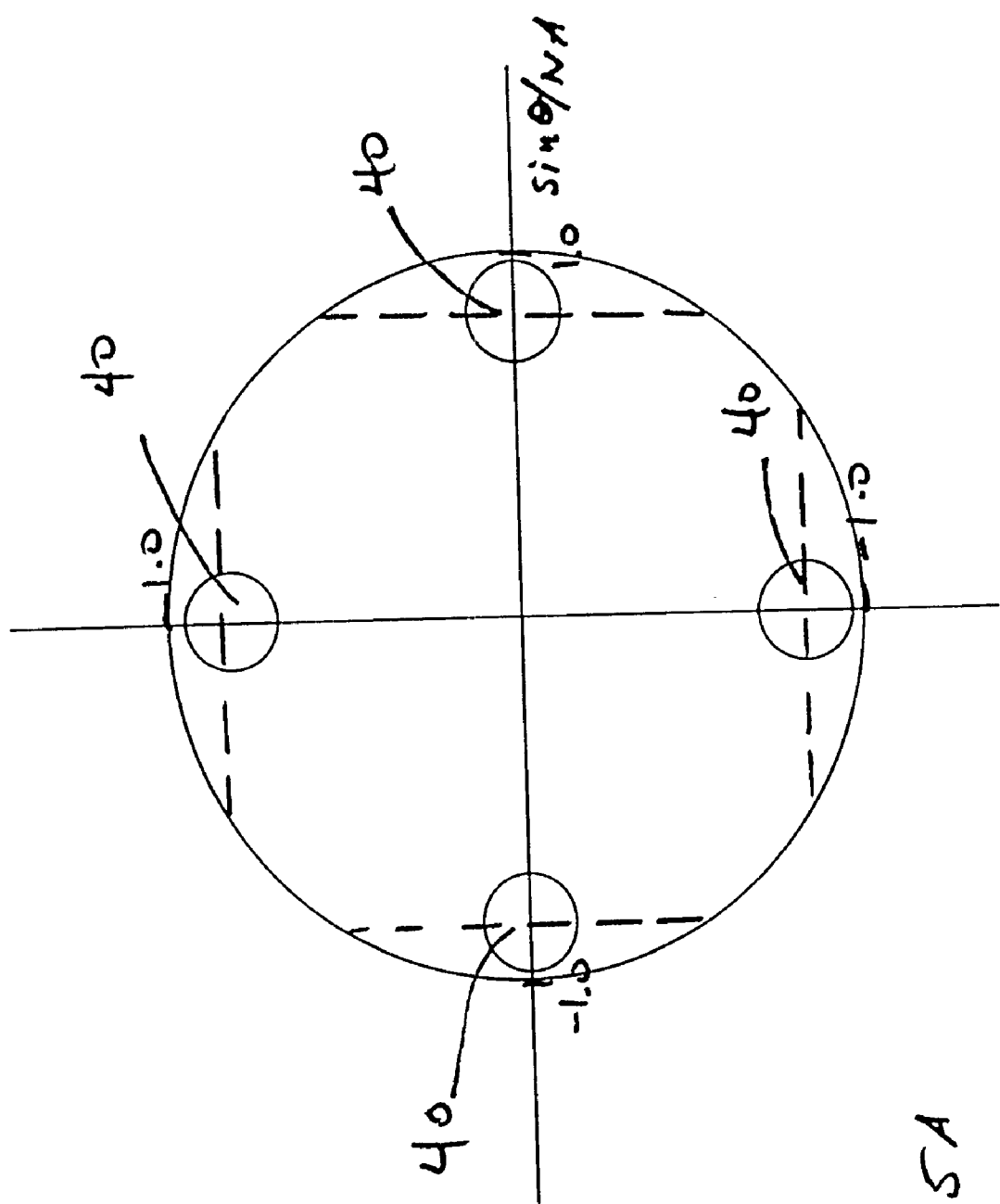

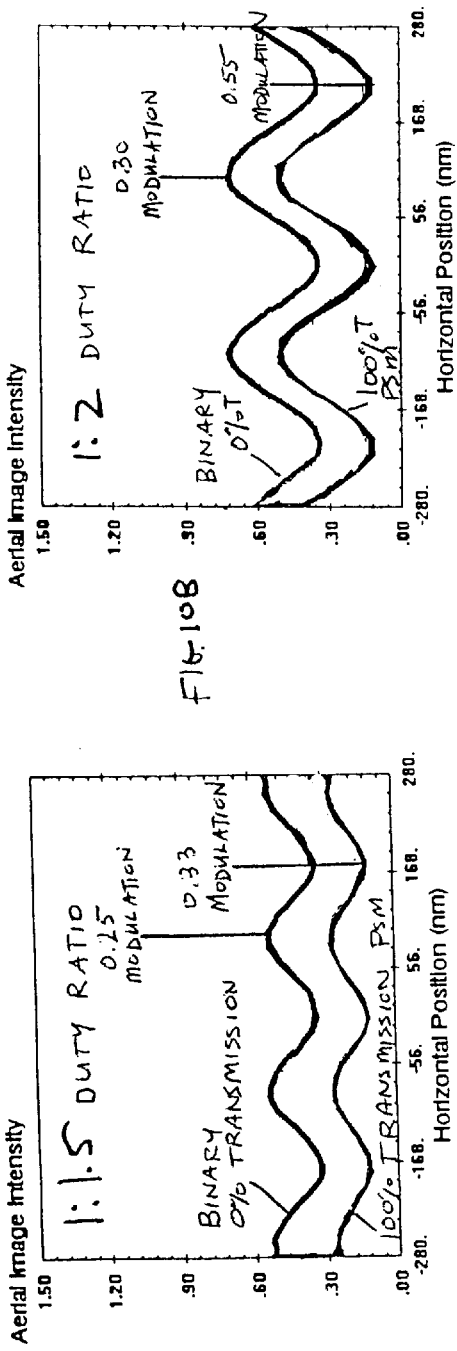
FIG. 10A
FIG. 10B
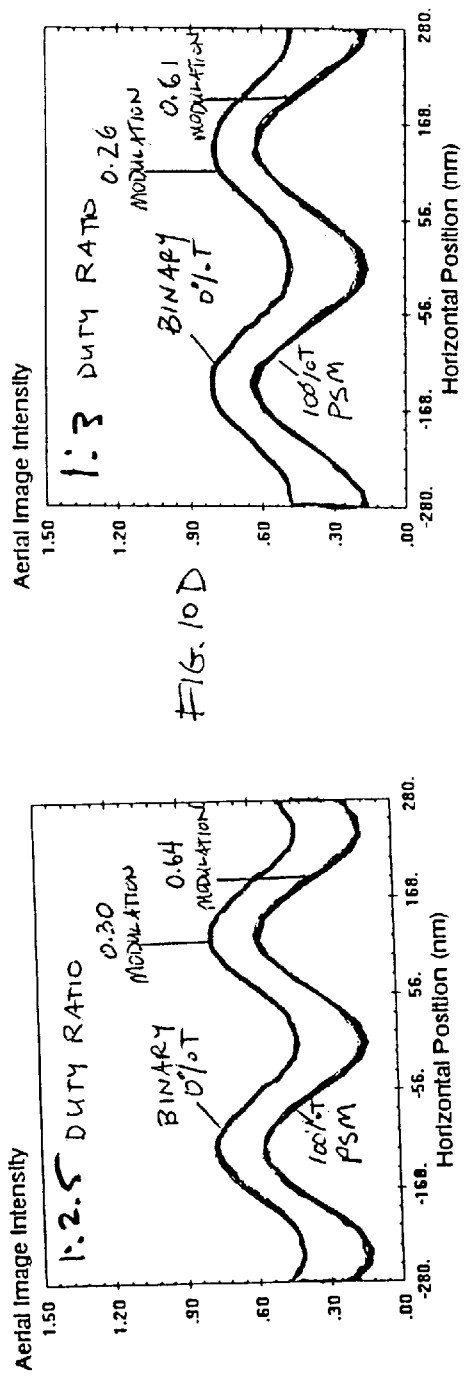
FIG. 10C
FIG. 10D

IMAGING METHOD USING PHASE BOUNDARY MASKING WITH MODIFIED ILLUMINATION

CROSS-REFERENCE TO RELATED APPLICATIONS

This application claims priority to U.S. Provisional Patent Application Serial No. 60/165,465, filed Nov. 15, 1999.

FIELD OF THE INVENTION

The present invention relates to a method of microlithography using an optical exposure system to project mask images for use in the fabrication of semiconductor devices.

BACKGROUND OF THE INVENTION

Optical lithography involves the creation of relief image patterns through the projection of radiation within or near the UV visible portion of the electromagnetic spectrum. Techniques of optical microlithography have been used for decades in the making of microcircuit patterns for semiconductor devices. Early techniques of contact or proximity photolithography were refined to allow circuit resolution on the order of 3 to 5 $\mu$m. More modern projection techniques minimize some of the problems encountered with proximity lithography and have lead to the development of tools that currently allow resolution below 0.15 $\mu$m.

Semiconductor device features are generally on the order of the wavelength of the ultraviolet (UV) radiation used to pattern them. Currently, exposure wavelengths are on the order of 150 to 450 nm and more specifically 157 nm, 193 nm, 248 nm, 365 nm, and 436 nm. The most challenging lithographic features are those which fall near or below sizes corresponding to 0.5 $\lambda$/NA, where $\lambda$ is the exposing wavelength and NA is the objective lens numerical aperature of the exposure tool. As an example, for a 248 nm wavelength exposure system incorporating a 0.60NA objective lens, the imaging of features at or below 0.18 micrometers is considered state of the art. FIG. 1 shows the configuration of a projection exposure system. Such an exposure system can be used in a step-and-repeat mode (referred to a stepper tool) or in a step-and-scan mode (referred to as a scanner tool). A UV or vacuum ultraviolet (VUV) source 1 is used to pass radiation through the illumination system 2 using a condenser lens system 3 and a fly's eye microlens array 4. An aperture 5 shapes the illumination profile to a defined area and radiation is relected from a mirror 6 to pass through an illumination lens 7 to illuminate a photolithographic mask 8. Upon illumination of the photomask 8, a diffraction field 11 distributed as spatial frequency detail of the photomask 8 is directed through the objective lens 9 to be imaged onto the photoresist coated semiconductor substrate 10. Such an exposure system forms an image by collecting at least more than the $0^{th}$-order of the diffraction field from the photomask 8 with the objective lens 9. The absolute limitation to the smallest feature that can be imaged in any optical system corresponds to 0.25 $\lambda$/NA. Furthermore, the depth of focus (DOF) for such an exposure tool can be defined as $+/-k_2\lambda/NA^2$ where $k_2$ is a process factor that generally takes on a value near 0.5.

As geometry sizes continue to shrink below 0.5 $\lambda$/NA, methods of resolution enhancement are being required to ensure imaging with adequate fidelity and depth of focus. Such methods of resolution enhancement developed over recent years can allow for improvement in addition to those made possible with shorter exposing wavelengths and larger numerical apertures. Off-axis illumination (OAI) and phase-shift masking (PSM) are current examples of resolution enhancement techniques.

By using OAI in a projection imaging system, image refinement is carried out by considering illumination apertures which are not necessarily circular. In a system where illumination is obliquely incident on the mask at angles so that the zeroth and first diffraction orders are distributed on alternative sides of the optical axis, two diffraction orders are sufficient for imaging. An illumination angle can be chosen using two uniquely placed circular poles (dipoles) for a given wavelength, NA, and feature size. This is shown for example in the prior art of FIG. 2, where the normalized angular distribution of illumination (sin $\theta$/NA)is represented. This illumination angle resulting from the two apertures, 20, is can be chosen for dense features as sin $\theta$=(0.5 $\lambda$/p) where p is the feature pitch. The most significant impact of this dipole off axis illumination is realized when considering focal depth. In this case, the zeroth and first diffraction orders travel a more similar path length compared to conventional illumination as defocus is considered.

Off axis illumination using dipole illumination, oriented in the direction of mask geometry, can offer the most significant enhancement to imaging performance. This is because only oblique illumination at an optimized illumination angle can be designed to allow projection of mask diffraction energy at the outermost edges of an objective lens pupil. Frequency doubling is made possible (at the limit where pole size approaches zero and point source behavior occurs) and extreme focal depth can be achieved (since radial usage of the objective lens pupil in limited to a narrow region near the outside edge). The problem with dipole illumination arises when geometry of both X and Y (or horizontal and vertical) nature is considered. In practice, by limiting illumination to allow for one narrow beam or pair of beams leads to zero intensity. Also, imaging is limited features oriented along one direction in an X-Y plane. To overcome this, an annular or ring distribution has been historically employed which delivers illumination at angles needed with a finite ring width to allow for some finite intensity [see for instance H. H. Hopkins, Proc. Royal Soc. A, Vol. 217, 408–432 (1953)]. The resulting focal depth is less than that for the ideal case but improvement over a full circular aperture can be achieved.

For most integrated circuit applicatons, features are limited to X and Y orientations only and a four pole or quadrupole configuration can be more suitable (see for instance U.S. Pat. No. 5,305,054). In these cases, a quadrupole type illumination is required to accommodate the two orthogonal orientations of mask features. Solutions for such quadrupole illumination is where poles are at diagonal positions oriented 45 degrees to X and Y mask features. This is shown in the prior art of FIG. 3. Here, each illumination pole, 30, is off axis to all mask features and image improvement for X and Y oriented features occurs. The maximum angle for this quadrupole illumination is limited compared to a dipole illumination because of the placement of poles on diagonal axes. The maximum illumination angle is smaller than that for the dipole configuration by a factor of the square root of two. Resolution or imaging potential is also reduced as compared to dipole type off-axis illumination by this factor of the square root of two. This diagonally oriented quadrupole approach to off-axis illumination, and variation on this approach including weak Gaussian-pole designs, has been used for optical microlithography applications for several years now. Imaging below 0.4 $\lambda$/NA (for 1:1 line to space ratio geometry) has not been demonstrated using this approach however.

Phase shift masking has been use for several years to improve lithographic imaging [see for instance Levenson et ale, "Improving Resolution in Photolithography with a Phase-Shifting Mask", IEEE Transactions on Electron Devices, vol. ED-29, No. 12, p. 1828-, December 1982]. With conventional binary masking, only the control of the amplitude of a mask function is considered and phase information is assumed to be non-varying additional manipulation of phase information at the mask can allow for improvement of imaging performance. For coherent illumination, when a π "phase shifter" is added at alternating mask openings in a mask, an objective lens pupil has a 50% decrease in required numerical aperture required to capture required diffraction orders. Alternatively, for a given lens numerical aperture, a mask which utilizes such alternating aperture phase shifters could image features one-half the size that is possible using a conventional binary mask. As partial coherence is considered, the impact of this phase shift technique is diminished to a point where for incoherent illumination no improvement is realized for phase shifting over the binary mask. This technique of phase shifting alternating features on a mask is appropriately called alternating phase shift masking. Phase information is modified by either adding or subtracting "optical" material from the mask substrate at a thickness which corresponds to a π phase shift.

Phase shift masking has been used to improve resolution and focal depth in projection lithography. Several types of phase shift masks are known including a chromeless or phase shift mask, which is shown in the prior art of FIG. 4 [see K. Toh et al. "Chromeless Phase-Shifted Masks: A New Approach to Phase-Shifting Masks", SPIE, vol. 1496, p. 27, 1990]. In this case, the boundaries of a large phase pattern are utilized as single dark imaging features through the production of localized destructive intensity regions at the imaging plane. Globally dark regions have be produced by placing many single phase edges in close proximity on the mask through use of checkerboard and other repetitive structures. Fine feature resolution (below 0.4 λ/NA) becomes difficult to demonstrate using this single phase boundary approach, as does the imaging of non-isolated geometry. Significant sizing biases have been also been required.

SUMMARY OF THE INVENTION

In view of the above described problems with the prior techniques of image resolution enhancement, there is a need for a method to allow for lithographic resolution at or below 0.4 λ/NA. The art also needs a method for lithographic imaging that combines an off-axis illumination and phase shift masking in such a way as to avoid the adverse problems associated with each to achieve resolution at or below 0.4 λ/NA, and a method that produces results that cannot be obtained without the said combination of the illumination and masking. The present invention provides a phase-shift mask which has two phase sifting boundaries or edges in close proximity so that the two edges form a single small dark region during image formation. The invention also provides an off-axis condition of illumination which places four poles on axis to accommodate the phase shift mask consisting of two phase shifting boundaries or edges in close proximity so that the two edges form a single small dark region during imaging, where a satisfactorily high degree of image contrast exists for image formation.

The present invention provides an imaging method for producing fine lithographic features oriented along two orthogonal directions. It includes an illumination source having four separate localized areas, each area having higher transmittance than portions of said illumination surrounding said areas. The areas are arranged at locations on the two orientation axes of the lithographic patterns and at a separation distance corresponding to the frequency of the fine pattern detail. The mask of the present invention is a phase shifting mask which comprises a transparent substrate and a phase shift formed into said substrate by etching the substrate to form fine phase shift features. The phase shift feature boundaries are spaced close together so that the destructive image intensities at the imaging plane for each feature are not individually resolved but instead produce single dark region by the overlap of destructive image intensity from the two boundaries during image formation using the said illumination source. The mask can include a transparent phase shift layer that comprises a material that is transparent and is a thickness so that a phase shift occurs. The phase shift layer is patterned by etching the layer to form the phase shift features and is used in combination with the said illumination source.

In the above described invention, a quadrupole illumination approach is used. It produces four poles placed on axial positions for off-axis illumination of X and Y oriented mask geometry, which we refer as "cross-quad" quadrupole illumination. This illumination method is not adequate for imaging improvement using conventional masking techniques because a two-pole pair on a given axis produces optimal off-axis illumination for the corresponding feature orientation while producing undesirable illumination for the orthogonal orientation. The problem can be understood if mask illumination and the resulting diffraction effects are considered, as shown in FIGS. 5A through 5C. An example of cross-quad illumination is shown in FIG. 5A, where poles, 40, are placed on illumination axes. As shown in the diffraction field of FIG. 5B for one mask feature orientation, the two optimized off-axis illumination pole pairs produce the intended off-axis illumination and desired distribution of diffraction energy, 50, in the objective lens pupil, 52. However, poles in the opposing orientation introduce undesired illumination and distribution of diffraction energy, 53. This undesired illumination of the conventional mask features behaves as low partial coherence, a condition that is not well suited for fine feature geometry. The problem is worsened further because of there is a two non-optimal pole contribution to the illumination. When considering the projection of diffraction energy, 53, from these non-optimal poles into the objective lens pupil, 52, the diffraction amplitude is twice that of the diffraction energy at the pupil edge resulting from the optimal off-axis illumination, 50. This type of quadrupole off-axis illumination would therefore be avoided in favor of the a diagonal quadrupole or other approaches for conventional masking.

However, there is an inherent advantage to the cross-quad quadrupole approach, namely, the absence of the square root of two factor that exists with the diagonal quadrupole approach. That factor limits imaging potential of the diagonal quadrupole as compared to the dipole-type illumination. The cross-quad quadrupole illumination distributes off-axis illumination angles in the same manner as the dipole and equivalent diffraction energy distribution results. To realize this increased potential we have discovered that the cross-quad approach may be combined with the unique condition of phase boundary phase masking where two fine phase shift feature boundaries are produced in close proximity. We refer to this phase masking method as "dual-boundary shifting". The cross-quadrupole and phase shift mask captures the diffraction energy for useful illumination.

More specifically, we have invented a projection imaging method where small sub-wavelength features are imaged using cross-quad illumination designed so that poles along a single illumination axis place diffraction orders that overlap and are distributed on opposite sides of the optical axis at identical radial positions. The poles are centered with respect to the fall illumination pupil at a location which corresponds to sin θ=λ/(2p), where p is the pitch or spacing between the closest features in the mask. This illumination is accomplished using an aperture filtering device (see U.S. patent application Ser. No. 09/422,398) a metal masking approach to aperture plane illumination filtering (see U.S. Pat. No. 5,305,054), a multiple beam splitter approach (see U.S. Pat. No. 5,627,625) or a diffractive optical element approach (see U.S. Pat. No. 5,926,257 or see U.S. Pat. No. 5,631,721). This illumination method is combined with dual-boundary shifting phase-shift masking where chromeless mask features are designed by placing phase edges at a separation distance smaller than the diffraction limit of the projection imaging system.

BRIEF DESCRIPTION OF THE DRAWINGS

FIG. 5A is a schematic representation of cross-quad quadrupole illumination with illumination poles on the illumination axes.

FIG. 10 shows simulated aerial image intensity plots of a cross-quad illuminated dual-boundary shifting phase-shift mask. These are four plots of 70 nm features with duty ratios of 1:1.5, 1:2, 1:2.5, and 1:3. Illumination wavelength is 193 nm and lens numerical aperture is 0.60. The plot shows how increasing the transmission of the phase shifted feature from 0% (corresponding to binary, non-phase shifted situation) to 100% dramatically improves image modulation.

DETAILED DESCRIPTION OF THE INVENTION

The preferred embodiment according to the present invention is a phase shift mask combined with an off-axis mode of illumination. The result is improvement beyond that which could be realized by either technique alone or that which could be predicted based on the performance of the masking or illumination alone. The phase-shift mask is chromeless and phase edge features are place close to each other, closer that the diffraction limit of the imaging system. The chromeless mask according to the invention is transparent where phase edges features on the mask allow for a phase shift through the change in the thickness of the transparent substrate between neighboring regions.

Figure 1:
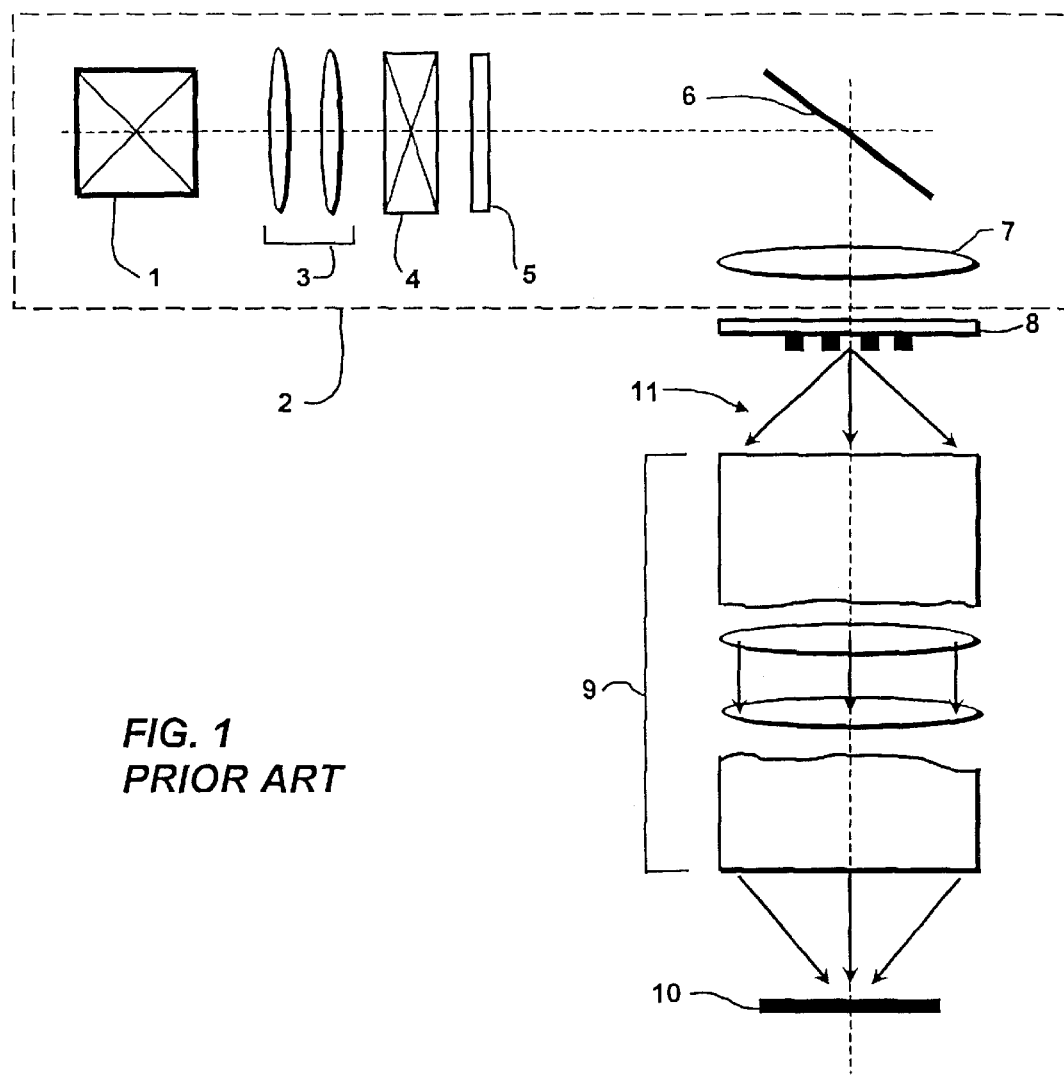
FIG. 1 is a schematic representation of a projection lithography system.
Figure 2:
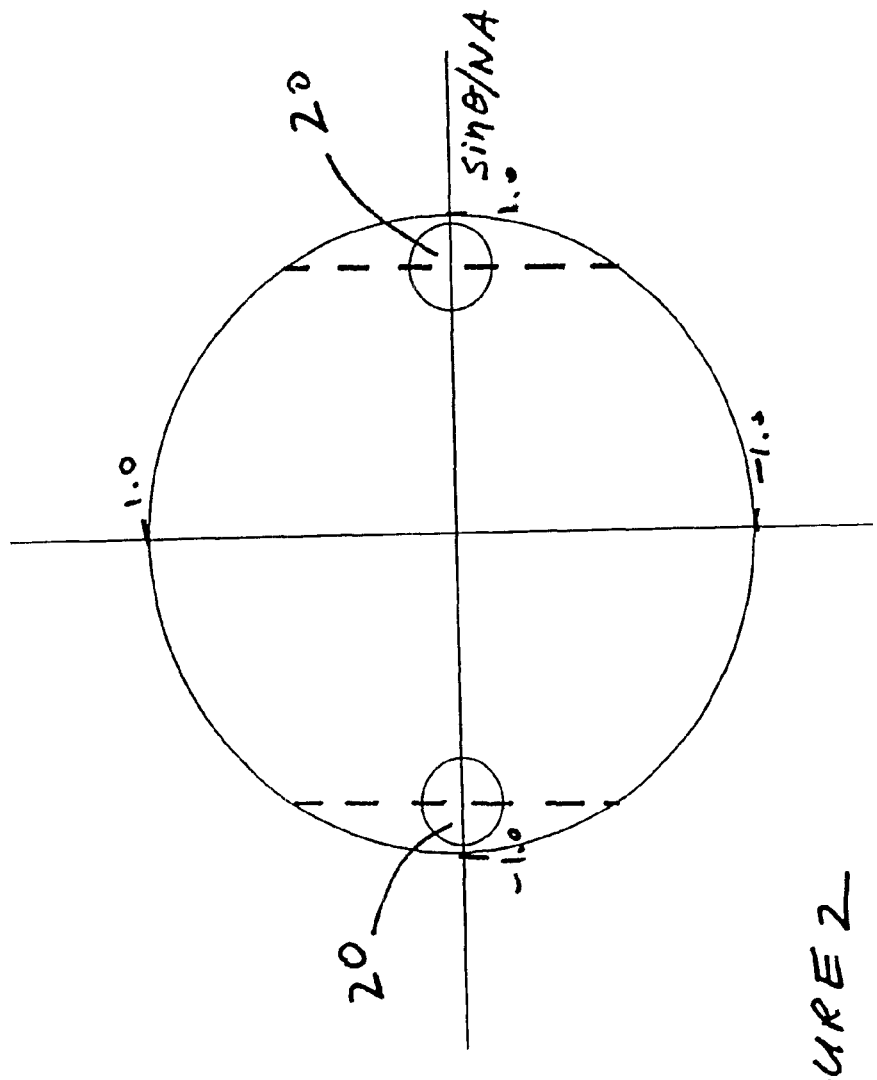
FIG. 2 is the illumination distribution of dipole illumination.
Figure 3:
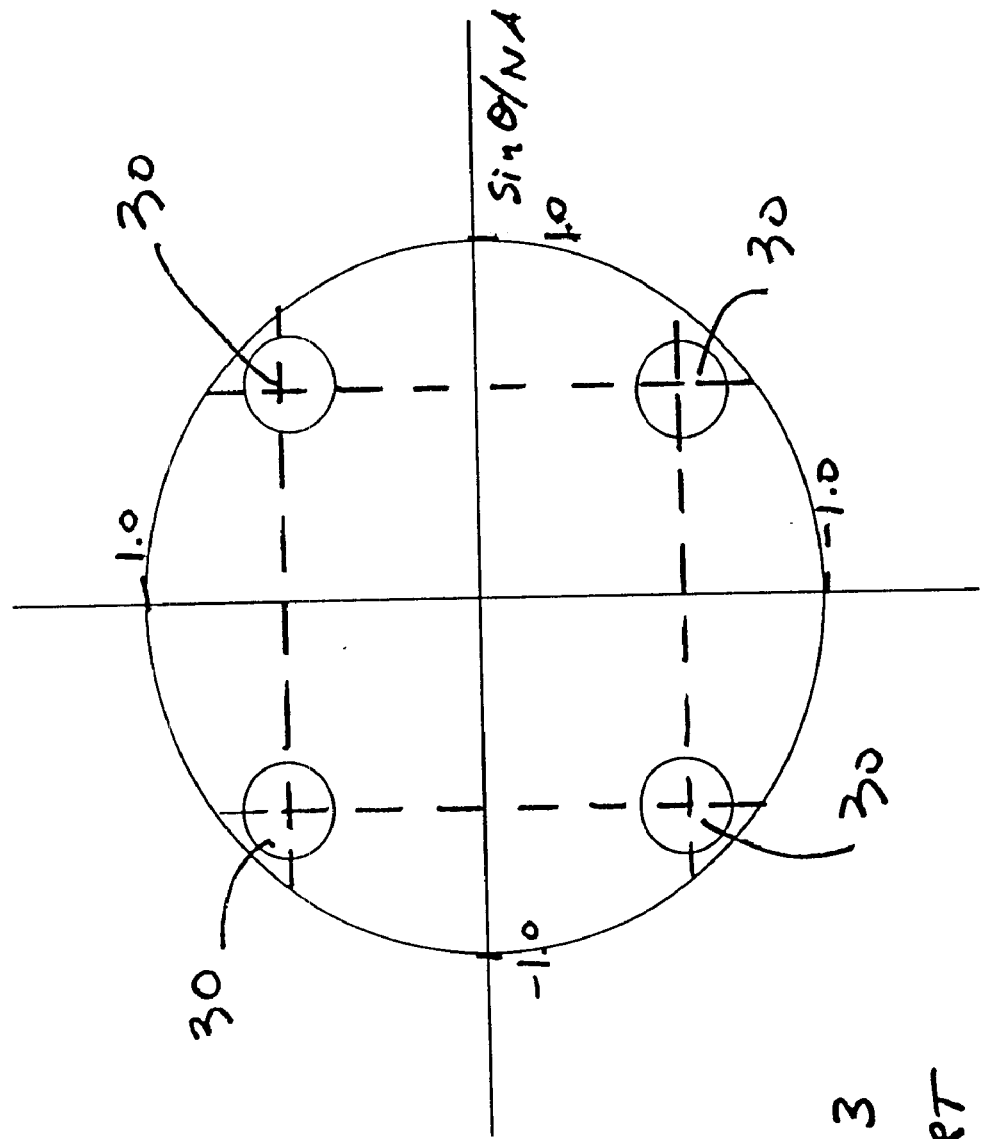
FIG. 3 is the illumination distribution of quadrupole illumination where illumination poles are located on diagonal positions with respect to mask geometry orientation.
Figure 4:
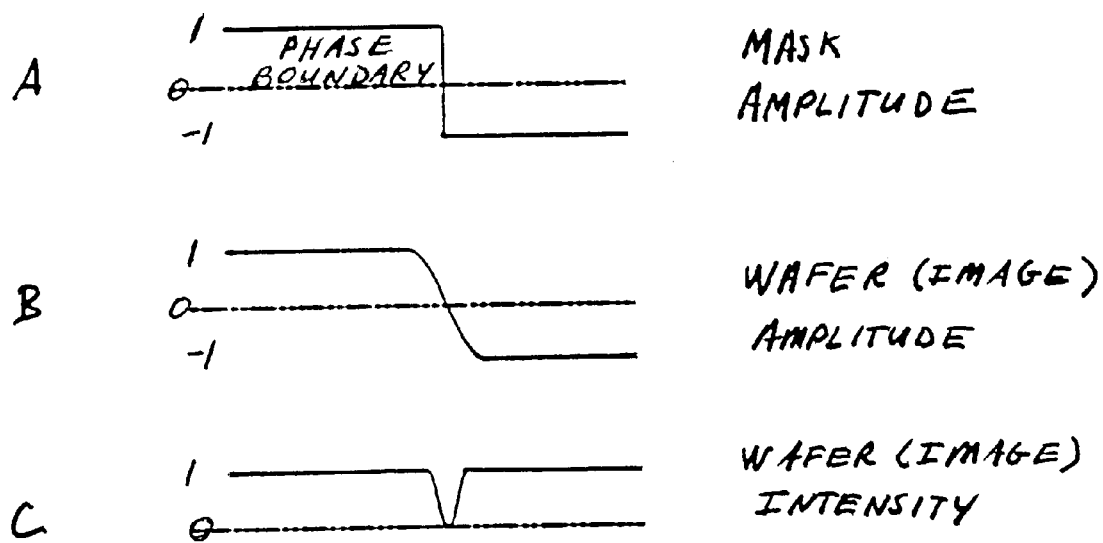
FIG. 4 is a schematic description of phase-edge phase shift masking.
Figure 5B:
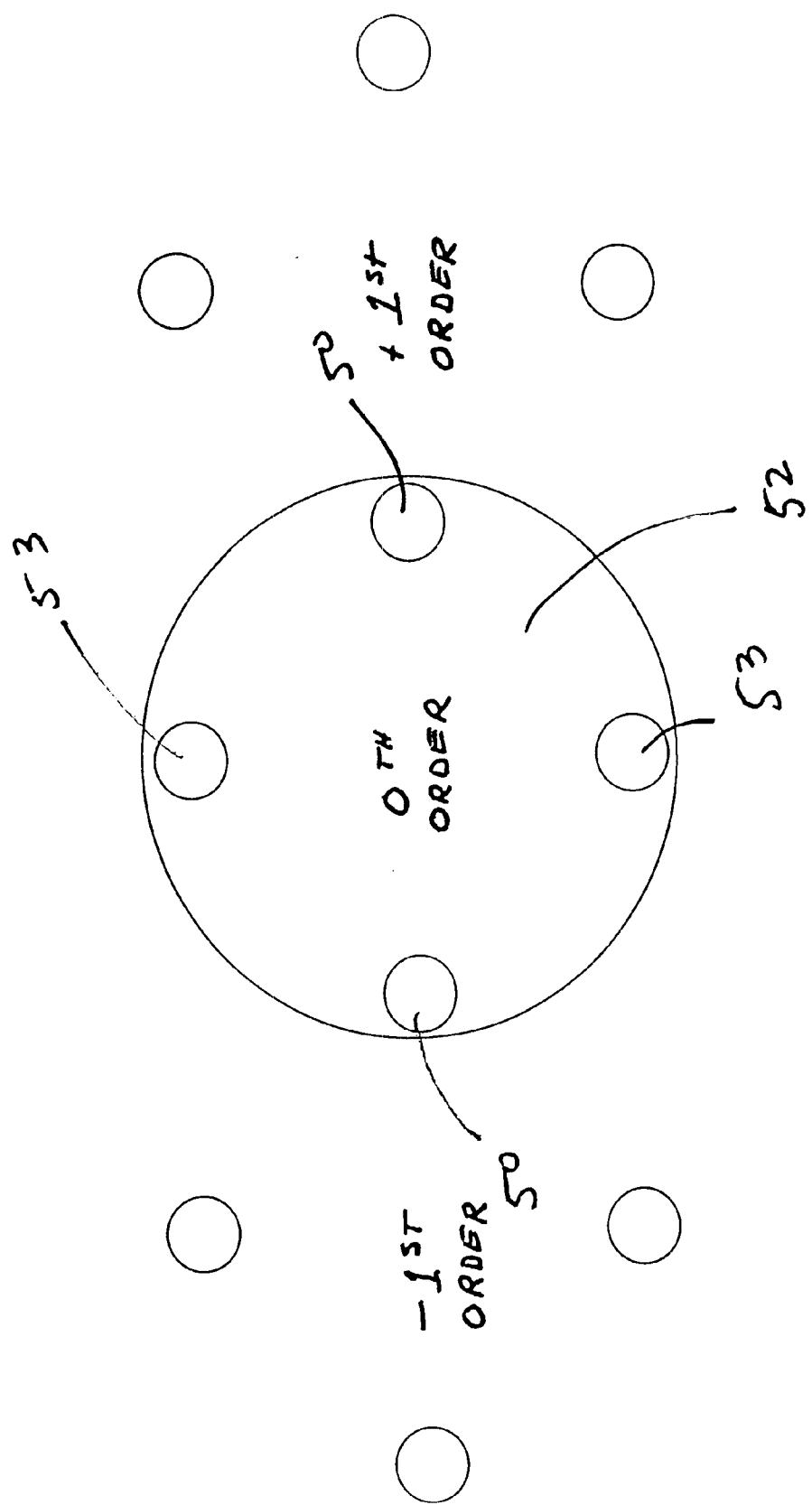
FIG. 5B shows the distribution of diffraction energy from the cross-quad illumination in the objective lens pupil.
Figure 6A:
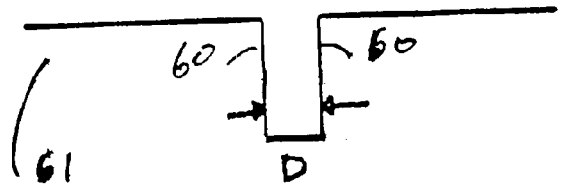
FIG. 6A is a schematic of a dual-boundary shifting phase shift mask where boundaries are defined by etching a mask substrate to a pi phase shift thickness, approximately 2000 angstroms for 193 nm wavelength.
Figure 6B:
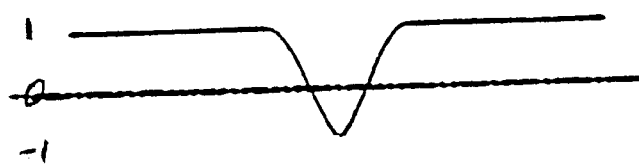
FIG. 6B is the normalized image electric field resulting from imaging of the dual-boundary shifting phase-shift mask.
Figure 6C:
FIG. 6C is the normalized image intensity resulting from imaging of the dual-boundary shifting phase-shift mask.

The phase shift can also be produced through use of a substrate with a transparent phase shifting film comprising a single layer or plurality of layers, in which the refractive index and thickness of the film allows for a phase shift between neighboring regions. In one example, the phase edge features are placed at a separation between 70 and 90 nm for a 193 nm wavelength and 0.60NA imaging system. FIGS. 6A through 6C are used to show the mask structure and the resulting images. FIG. 6A shows two phase edge features, 60, etched into a mask substrate, 61, at a sub-wavelength separation distance D, which would correspond a distance in the region of 0.2 λ/NA to 0.3 λ/NA on the wafer or a multiple of this, where the multiple is determined by the reduction ratio of the exposure tool, which is for example a value of 4 for a current 193 nm lithography system. Mask fabrication is accomplished using the quartz etch of thin film patterning techniques. As an example for the case where the phase shift is etched into the substrate, a 0.25" fused silica mask substrate is used and coated with a chromium masking layer. The thickness of the chromium coating is approximately 1000 Å and is deposited using RF magnetron sputtering techniques. An electron beam resist is coated over the chromium, approximately 4500 Å in thickness. Mask lithography is carried out in the normal manner, where an electron beam mask writer is used to expose desired patterns into the electron beam resist. The desired patterns comprise phase boundaries that are separated by small distances when compared to the diffraction limit of the lithography tool. In pairs, these phase boundaries are the dark features created during the lithographic imaging process. After exposure, an electron beam resist developer is used to developed the exposed resist. A chromium etchant is used to remove the chromium in the areas opened in the resist A fluorine based plasma etchant such as $SF_6$ is used to transfer the pattern open in the resist and chromium into the fused silica substrate. The etch depth is such that a pi phase shift results. For fused silica with a refractive index of 1.561, this etch depth is 185 Å. Electromagnetic effects of the feature boundaries during optical exposure using the mask may be taken into account to impart deviation onto this required thickness but the goal remain to achieve a phase shift between the etched regions on the mass and un-etched regions. After the substrate is etched, a resist stripper is used to remove the resist and a chromium etchant is used to remove the chromium.

FIG. 6B shows the resulting electric field at the image plane from imaging with the mask. The loss of high frequency detail causes corner rounding of the electric field modulation. FIG. 6C shows the resulting intensity at the image plane, where small zero intensity regions are produced. The individual zero intensity regions are not uniquely resolved due to their proximity and these regions will print as a single dark feature.

Figure 7:
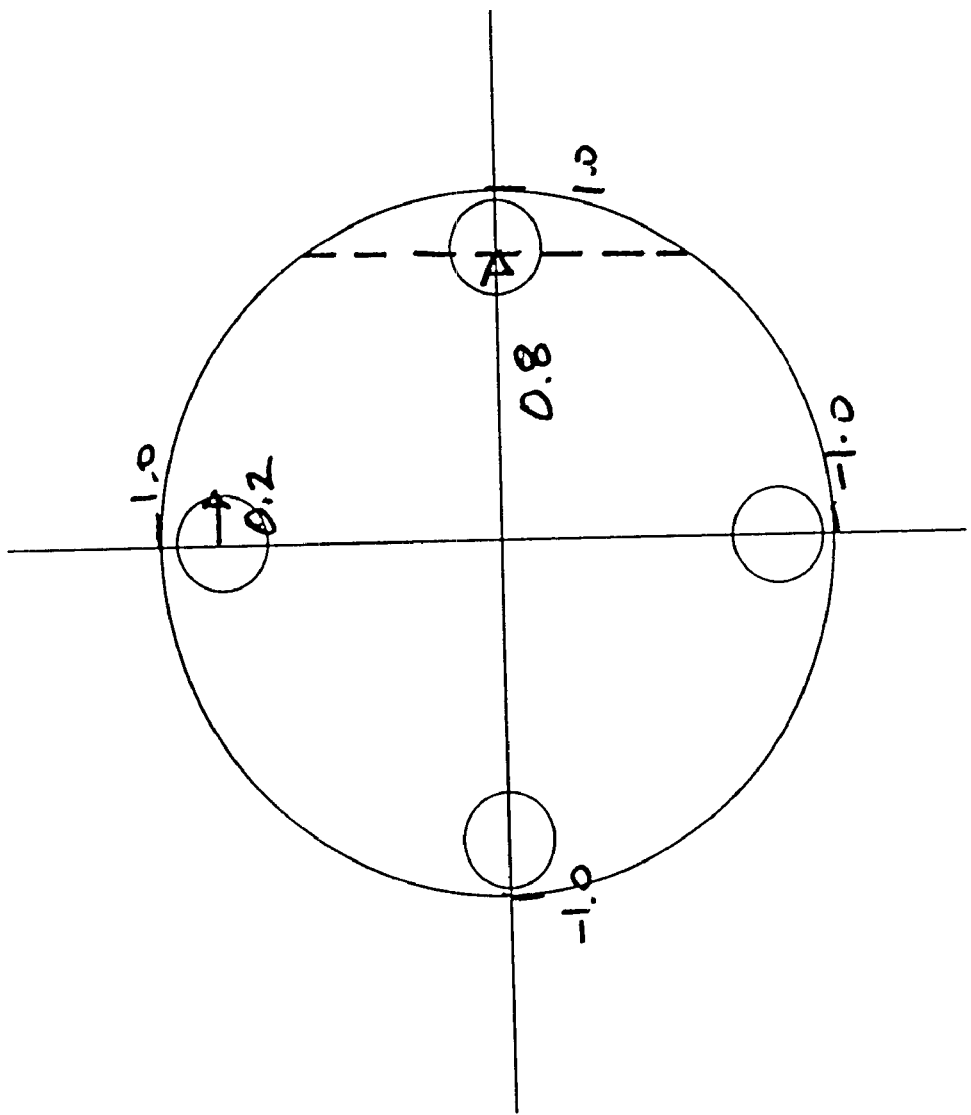
FIG. 7 shows the distribution of poles in the cross-quad illuminator.
Figure 8:
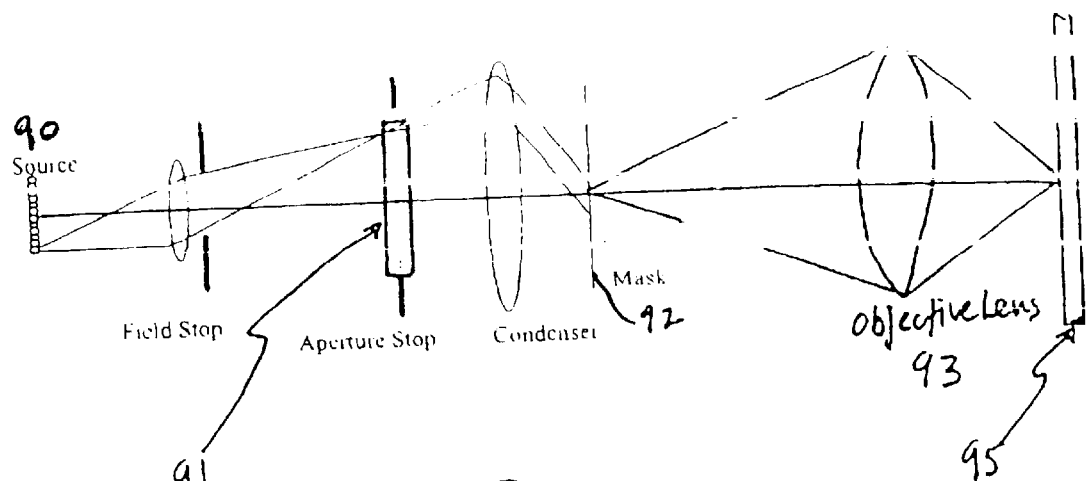
FIG. 8 shows the implementation of the invention into a lithography tool.
Figure 9:
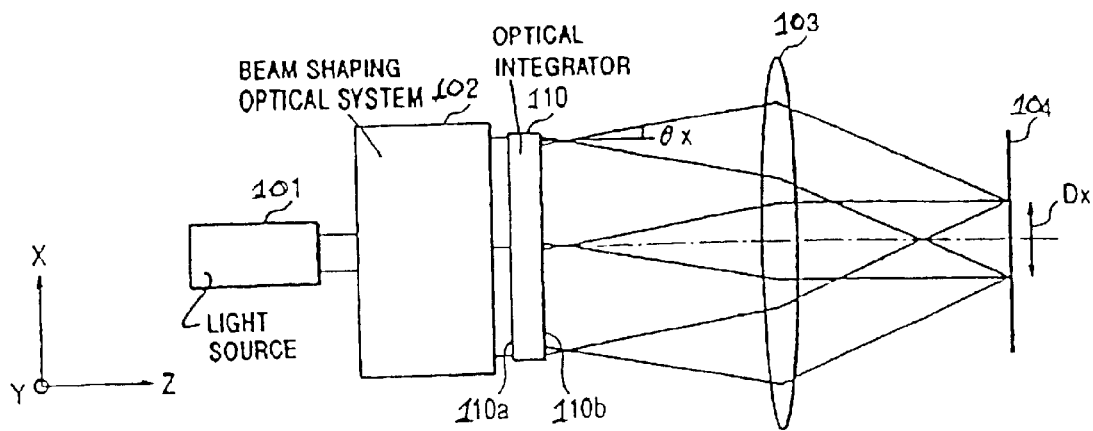
FIG. 9 is a beam-shaping method to forming the cross-quad illumination.

Cross-quad illumination is chosen accommodate a range of line size and pitch values for fine features on the mask. As an example, four poles are used, placed on opposite sides of the two axes that coincide with the mask feature orientation axes. Poles are placed at equal distances from the center of the illumination with a pole center to illuminator center distance of 0.80 of the full illuminator radius. The radius of each pole is 0.20 of the fall illuminator radius. This configuration is shown in FIG. 7. The invention is implemented in existing illumination systems via access to the illumination optical system. One example is shown in FIG. 8. There, a light source 90 generates a light beam that is directed through a condenser lens system. Within this system, an aperture mask is placed in the condenser lens pupil plane. The mask 91 controls the shape of the light beam into the cross-quad intensity distribution, which illuminates the dual-boundary phase-shift mask, 92. An objective lens, 93, directs an image to the wafer plane, 95. In another example, a beam-shaping optical system of an illumination system (FIG. 9) is modified to produce the desired cross-quad illumination. The illumination optical system contains a beam shaping optical system 102 and optical integrator 110. A light source such as an excimer laser 101 is used for illumination. The beam shaping optical system 102 shapes the light beam coming from source 101 into the cross-quad shape and directs this shaped beam onto the surface of an optical integrator 110. The optical integrator can consist of, for example, a fly's eye array or one or more diffractive optical elements. The condenser lens system 103 illuminates the mask with Köhler illumination. The intensity distribution in the plane 104 is a result of tee cross-quad shaping of the illuminator and is the Fourier Transform of the illuminated shape. Since Köhler illumination systems are used extensively in lithographic applications and are well known to those of ordinary skill in the art of illumination system design, details of the beam shaping optical system will not be detailed here. The beam shaping optical system can contain one or more optical elements, which can include prisms, lenses, cones, and other similar components.

Illumination of the mask results in two enhancement effects that work together with each other. The cross-quad illumination places diffraction energy at appropriate frequency positions. The "weakening" of the off-axis illumination that results from the two non-optimal poles of the cross-quad is compensated through the phase-edge emphasis of the dual-boundary shifting phase shift mask. Full scalar based lithographic image modeling has been utilized to demonstrate the image formation consequences of the invention. FIGS. 10A through 10D show these results. The four plots are of 70 nm features with duty ratios of 1:1.5, 1:2, 1:2.5, and 1:3. These duty ratios correspond to the line to space feature ratios of the features as imaged by the present invention. The illumination wavelength is 193 nm and lens numerical aperture (NA) is 0.60 for each case. In FIG. 10A, aerial image intensity is plotted against horizontal position for a cross-quad illuminated 1:1.5 phase-boundary shifting phase shift mask where the transmission of the region between the phase boundaries is increased from 0% to 100%. For a transmission of 0%, the mask corresponds to a conventional binary mask and for a transmission of 100%, the mask corresponds to the phase-boundary shifting mask of the invention. FIGS. 8B through 8D are similar plots for the remaining duty ratio values. Each figure shows how increasing the transmission of the phase shifted feature from 0% to 100% improves image modulation, as defined by the ratio:

Modulation=$(I_{min}-I_{max})(I_{min}+I_{max})$

This is accomplished through a decrease in minimum intensity values as well as an increase in the slope of the sidewall angle of the intensity images.

Figure 11B:
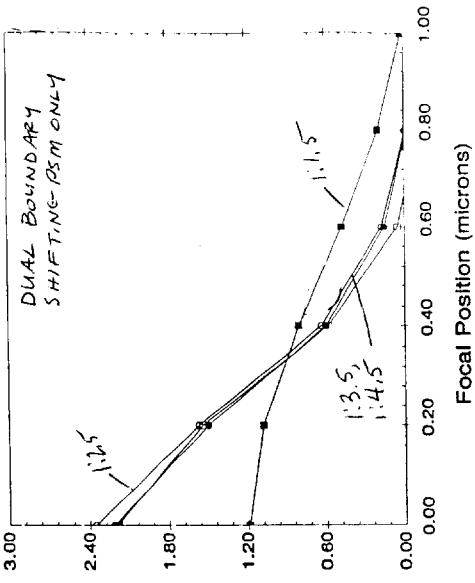
FIG. 11B shows aerial images through NILS measurement showing how cross-quad approach with the dual-boundary shifting phase-shift mask compares to chrome masking and the same cross-quad illumination
Figure 11A:
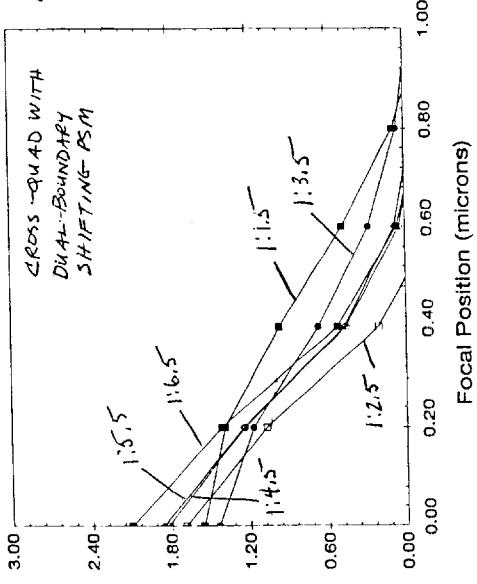
FIG. 11A shows aerial images through NILS measurement showing how cross-quad approach with the dual-boundary shifting phase-shift mask allows for imaging of 80 nm features.
Figure 11C:
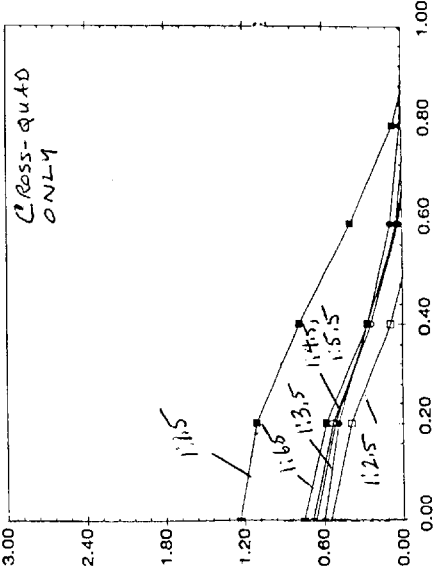
FIG. 11C shows aerial images through NILS measurement showing how cross-quad approach with the dual-boundary shifting phase-shift mask compares to dual-boundary shifting with conventional illumination.

These results are better than the illumination or masking methods alone, as shown in FIGS. 11A through 11C for 80 nm features (as imaged) with spacing values of 120 to 520 nm (as imaged), corresponding to 1:1.5 through 1:6.5 duty ratios. These figures are a comparison of aerial images through NILS measurement showing how cross-quad approach combined with the phase-boundary shifting phase shift mask (FIG. 11A) allows for imaging of 80 nm features through focus compared to chrome masking and the same illumination (FIG. 11B) and phase-boundary shifting phase shift mask and conventional illumination (FIG. 11C). In all cases, the normalized image log slope (NILS) defined as:

NILS=d ln I(x)/dx at the mask edge is greater for the imaging shown in FIG. 11A through a greater range of focal positions.

Figure 12:
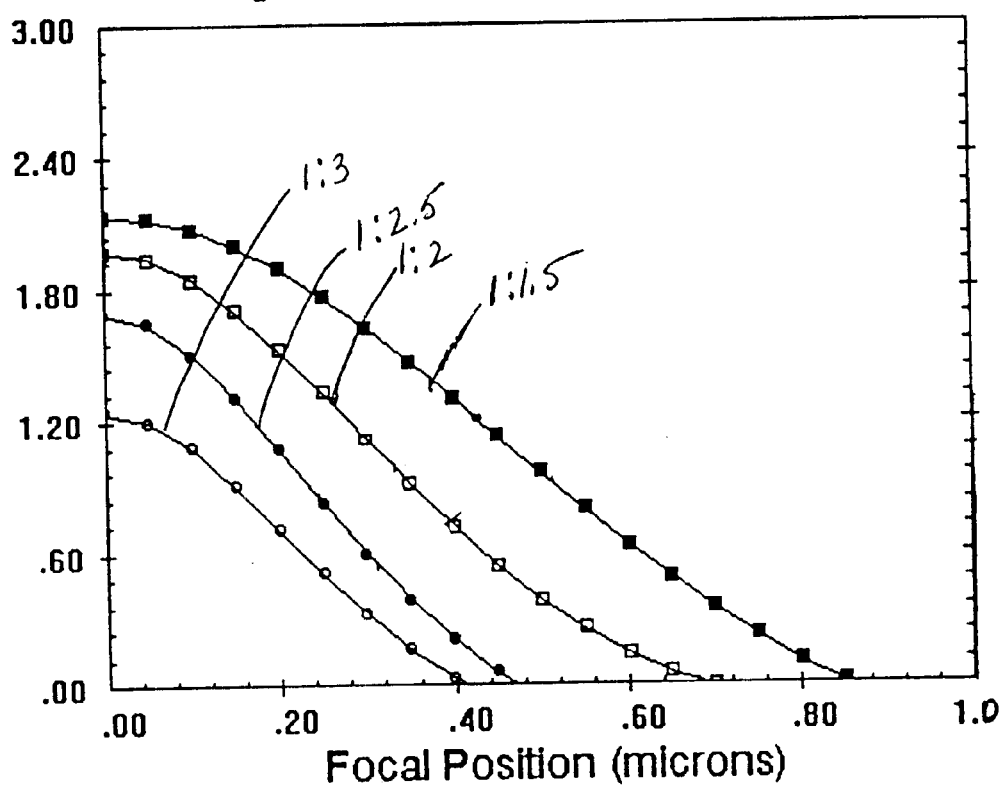
FIG. 12 shows a composite NILS plot for 80 nm geometry using the cross-quad approach and the dual-boundary shifting phase-shift mask using mask bias to adjust the performance of features of various duty ratio.

FIG. 12 is a composite NILS plot for 80 nm geometry of various duty ratios (1:1.5, 1:2, 1:2.5, and 1:3) using the cross-quad approach and the phase-boundary shifting phase shift mask of the invention, using mask bias to adjust the imaging performance of features of various duty ratios. By giving the 1:1.5 duty ratio features a 60 nm increased sizing bias, the NILS performance is improved.

Figure 13:
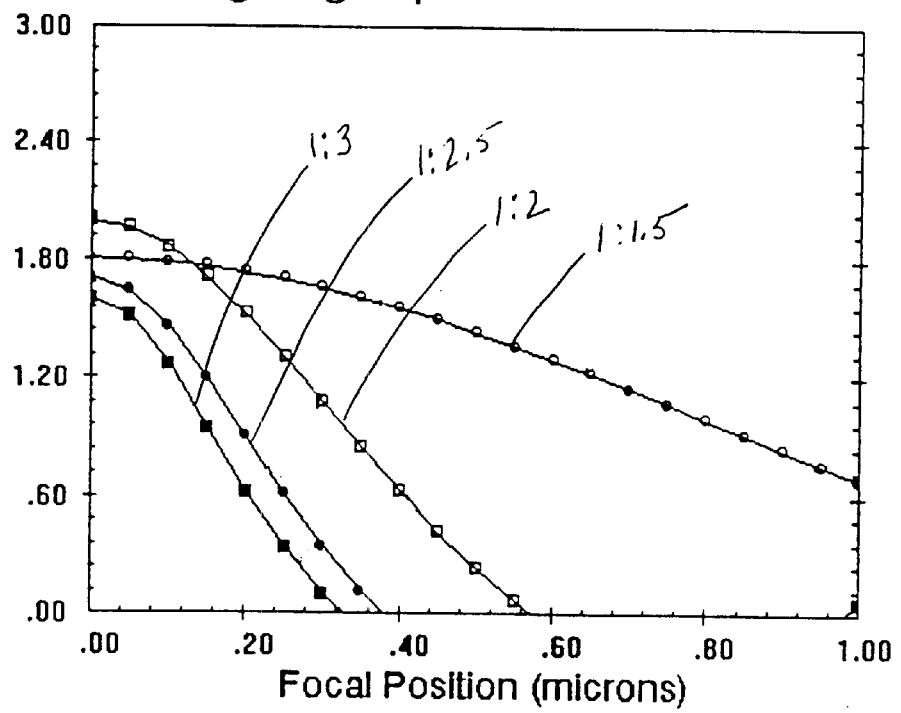
FIG. 13 is a composite NILS plot for 70 nm geometry using the cross-quad approach and the dual-boundary shifting phase-shift mask using mask bias to adjust the performance of features of various duty ratio.
Figure 14B:
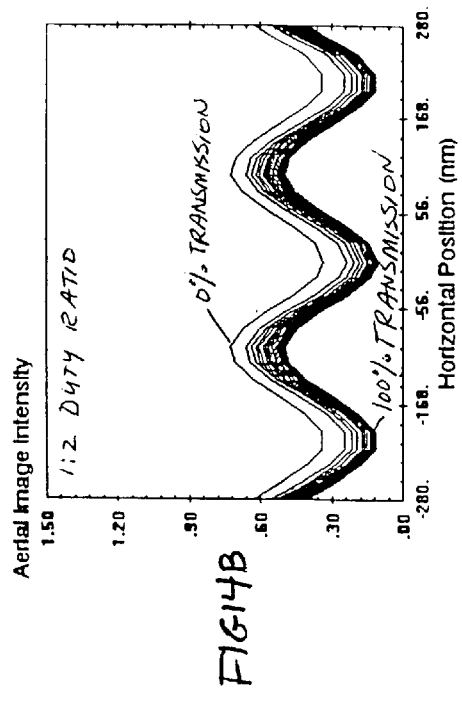
FIG. 14 shows simulated aerial image intensity plots of a cross-quad illuminated dual-boundary shifting phase-shift mask with transmission between the boundaries increasing from 0% to 100%. These are four plots of 70 nm features with duty ratios of 1:1.5, 1:2, 1:2.5, and 1:3. Illumination wavelength is 193 nm and lens numerical aperture is 0.60. The plot shows how increasing the transmission of the phase shifted feature from 0% to 100% dramatically improves image modulation.
Figure 14D:
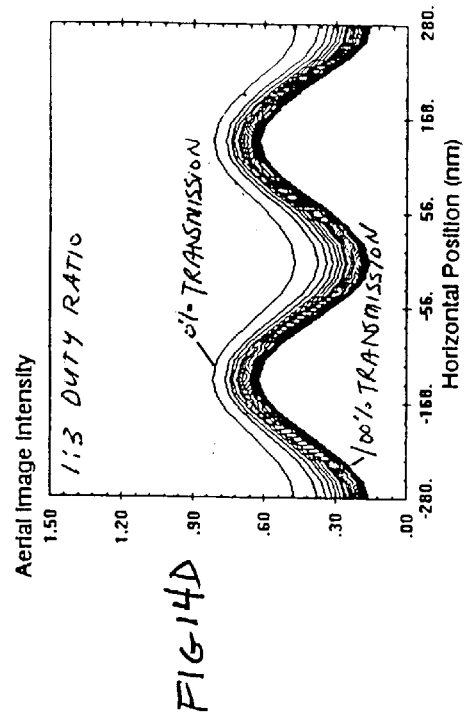
Figure 14A:
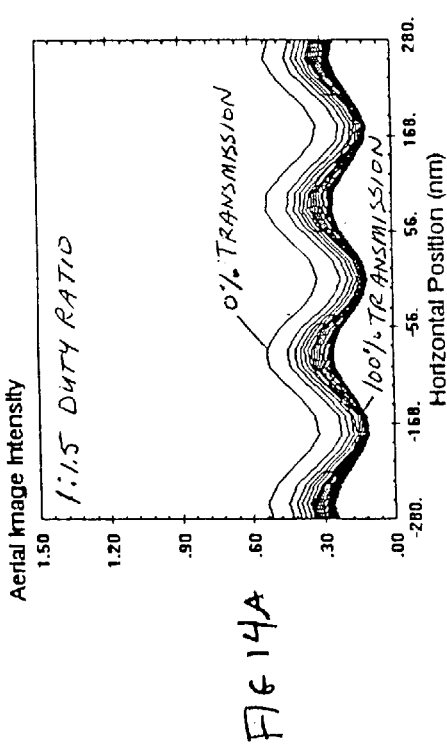
Figure 14C:
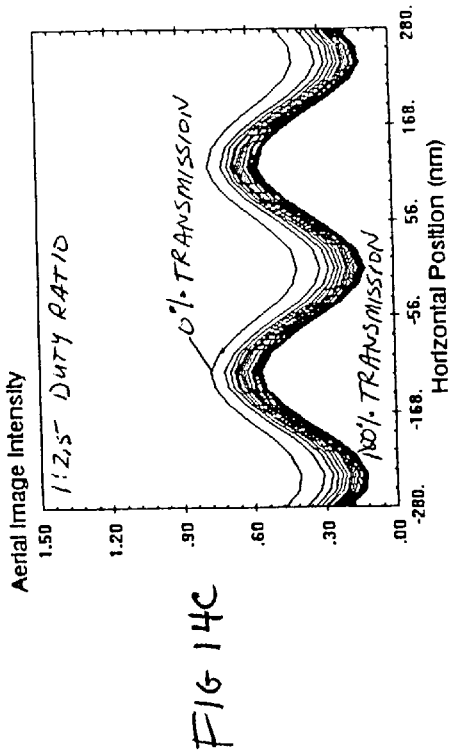

FIG. 13 is a composite NILS plot for 70 nm geometry of various duty ratios (1:1.5, 1:2, 1:2.5, and 1:3) using the cross-quad approach and the phase-boundary shifting phase shift mask of the invention, using mask bias to adjust the imaging performance of features of various duty ratios. By giving the 1:1.5 duty ratio features a 65 nm increased sizing bias, and by giving the 1:3 duty ratio features a 80 nm increased sizing bias, the NILS performance is improved.

Full resist simulation was carried out for 80 nm geometry of various duty ratios (1:1.5, 1:2, 1:2.5, 1:3.5, and 1:4.5) using the cross-quad approach and the phase-boundary shifting phase shift mask of the invention, using a mask bias to adjust the imaging performance of features of various duty ratios. Simulation was carried out using a commercial lithography simulator (Prolith/5) and a resist model for 193 nm image formation. For each 80 nm CD duty ratio, a matrix of focus values vs. exposure dose values was simulated, commonly referred to as a focus-exposure matrix. Operable process windows can be measured using this matrix method, where exposure dose values required to print a feature at a targeted size (E size) within a usable depth of focus (DOF) can be determined. Table 1 summarizes these results. For each 80 nm duty ratio, a feature bias was chosen to produce maximum DOF to maximize the commonality in E size across duty ratios. The best exposure value is shown for each duty ratio along with the bet focus. As seen in this table, 80 nm features within the 1:1.5, 1:2, 1:2.5, 1:3.5, and 1:4.5 duty ratios are imaged to the required size with exposure dose values between 59.55 and 79.55 mJ/cm$^2$ and focus values between −0.01 and −0.11 $\mu$m. This corresponds to an average exposure value of 70 mJ/cm$^2$ with a +/−14% variation and a +/−0.05 $\mu$m focus variation. This result is identical for features oriented in X and Y directions.

TABLE 1

Process window results for invention showing the capability of resolving 80 nm features with 193 nm wavelength and 0.60 NA.

| 80 nm CD Duty Ratio | Biased to | E(size) | DOF @ 5% | Best Exp. | Best Foc. |
|---|---|---|---|---|---|
| 1:1.5 | 60 nm | 58 mJ/cm$^2$ | 0.96 um | 59.55 mJ/cm$^2$ | −0.01 um |
| 1:2 | 80 | 79.97 | 0.53 | 79.93 | −0.11 |
| 1:1.5 | 70 | 67.94 | 0.83 | 68.68 | −0.06 |
| 1:1.5 | 80 | 77.45 | 0.86 | 78.10 | −0.06 |
| 1:2.5 | 80 | 78.68 | 0.24 | 79.52 | −0.10 |
| 1:3 | 80 | 73.59 | 0.19 | 79.52 | −0.10 |
| 1:3.5 | 80 | 60.00 | 0.17 | 75.52 | −0.10 |

An additional embodiment of the intention is the use of the modified cross-quad technique combined with the phase-boundary shifting phase shift mask where the transmission between phase boundaries is a value less than 100%, as shown in the aerial image plots of FIGS. 14A through 14D. These plots show how transmission values greater than 0% and up to 100% produce results superior to those for 0% transmission, which is the case for a binary mask. Transmission of the shifter can be either biased or not. The mask is fabricated using attenuated phase shift masking methods, such as those described by Smith in U.S. Pat. No. 5,939,277. The attenuated phase-boundary shifting phase shift mask includes a substrate and a single layer or plurality of layers layer disposed on the substrate, at a thickness to produce a pi phase shift and the predetermined transmittance value between greater than 0% and up to 100%.

The present invention is described but is to be understood that it is not limited to these descriptive examples. The numerical values, poles, shapes, and phase mask parameters may be changed to accommodate specific conditions of imaging masking, feature orientation, duty ratio requirements and the like as required to achieve high integrated circuit pattern resolution. The examples described here do not limit the application of the invention an, those practiced in the art understand that the invention may be used with and applied do other wavelengths and with variations in imaging situations.

The invention may be used in an illumination system that employs a masking aperture 91, as shown in FIG. 8, fabricated as an optical component reticle, patterned and dithered to allow for control of the projected light distribution at the mask plane 92, and inserted at the condenser lens pupil plane. This masking aperture 91 comprises a translucent substrate and a masking film. The distribution of the intensity through the masking aperture is determined to provide off-axis illumination in a cross-quad quadrupole illumination configuration, or in an annular or ring configuration. The poles may have varying intensity, which is accomplished by creating a half-tone pattern via pixelation of the masking film, thereby allowing for maximum variation in illumination beyond simple binary (clear or opaque) options.

More specifically, the invention may include a mask for an illumination system to provide controlled cross-quad illumination. The mask acts as a diffraction element. The pattern of pixels and the intensity of the pattern determine the illumination pattern that illuminates the photomask. The illumination mask is a translucent substrate with an illumination control pattern for defining four cross-quad zones of illumination. Each zone comprise pixels that are patterned in accordance with a selected wavelength of incident light to diffract the incident light into an illumination pattern for illuminating a photomask. Each of the pixels is constructed with a matrix of subpixels. In the preferred embodiment the array of subpixels is 8×8.

The intensity is modulated by the number of pixels. The highest intensity pixel has no subpixels. Light of suitable wavelength passes through without attenuation. A pixel with 64 subpixels attenuates or blocks all light. Pixels of intensity between none (0%) and all (100%) are created by the number of subpixels in a given pixel. Random patterns and other patterns may produce artifacts similar to moire patterns. Such artifacts are undesired. I discovered that a dithered pattern using position dependent thresholds produced illumination patterns that had little or no artifacts.

The masking aperture is a bi-level representation of the desired intensity distribution in the illuminator. It is desired to have a varying intensity transition from open to opaque areas. To achieve this result, the illumination pattern is divided into pixels and each pixel is a matrix of subpixels. Dithering or pixelation of the continuous distribution of intensity is used for translation to the binary or bi-level masking aperture. Individual masking subpixels are small, on the order of 10 to 100 $\mu$m, and are either translucent or opaque. The continuous tone nature of the illumination intensity profile is translated by controlling the spatial density of the bi-level display states on the masking aperture. Several decision rules may be implemented to produce the output distribution on the masking aperture. A fixed threshold technique is simplest in form, but an ordered dithering approach may be used to most effectively translate a continuous tone intensity profile into a bi-level masking aperture representation. Intensity values are compared to a position-dependent set of threshold values, contained in a n×n dither matrix. A set of selection rules repeats the dither matrix in a checkerboard arrangement over the illumination field. The key to this approach is the generation of a bi-level representation of the continuous tone image with the minimal amount of low spatial frequency noise. In other words, the occurrence of texture, granularity, or other artifacts is reduced to a minimum, allowing for the critical control of illumination uniformity demanded in projection exposure tools.

The resulting bi-level representation of the continuous tone cross-quad illumination profile is then suitable for recoding into a photo-sensitive or electron beam-sensitive resist material through use of mask pattern generator. Such a resist material, when coated over an opaque film on translucent substrate, can allow for pattern delineation and creation of the masking aperture.

Figure 15:
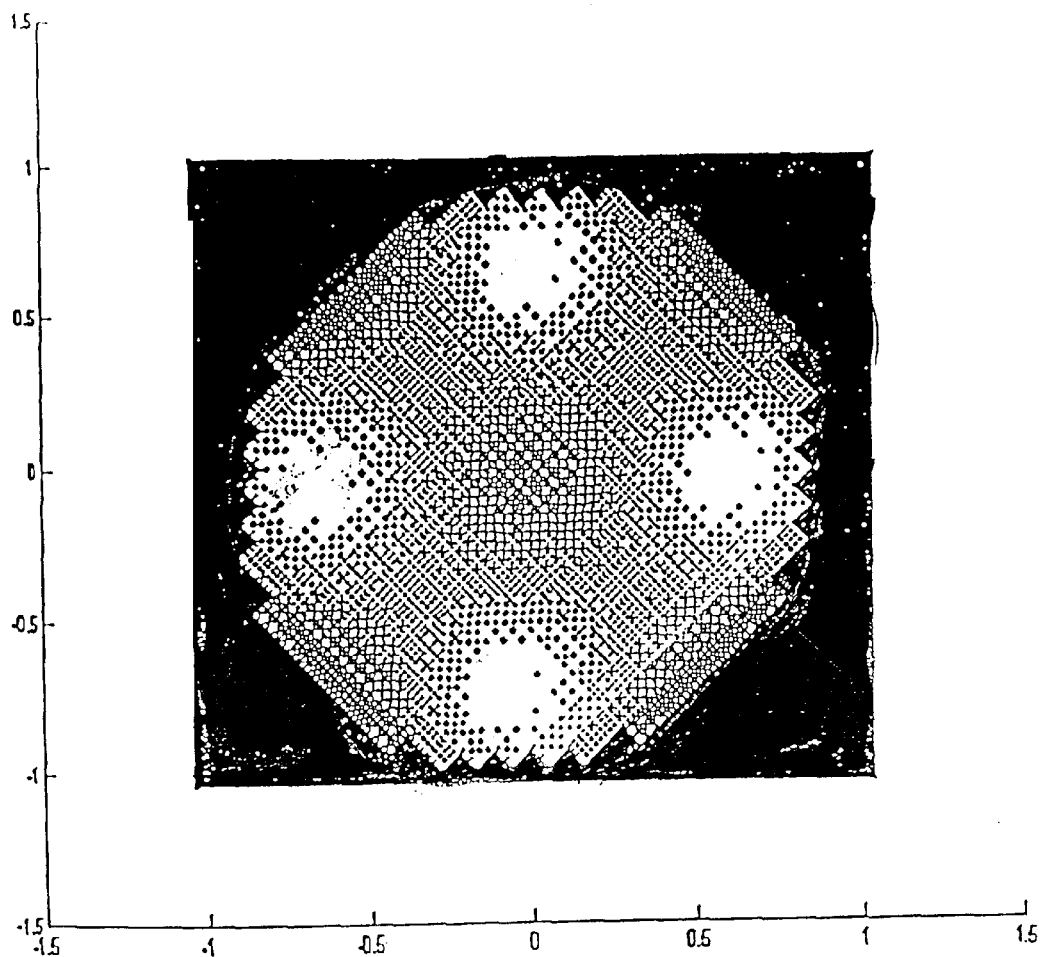
FIG. 15 is a plot of the x-y distribution of dithered bilevel masking cells for an illumination aperture consisting of four circular normal distributed-intensity zones placed at diagonal positions corresponding to off-axis illumination for geometry oriented in horizontal and vertical directions.
Figure 16:
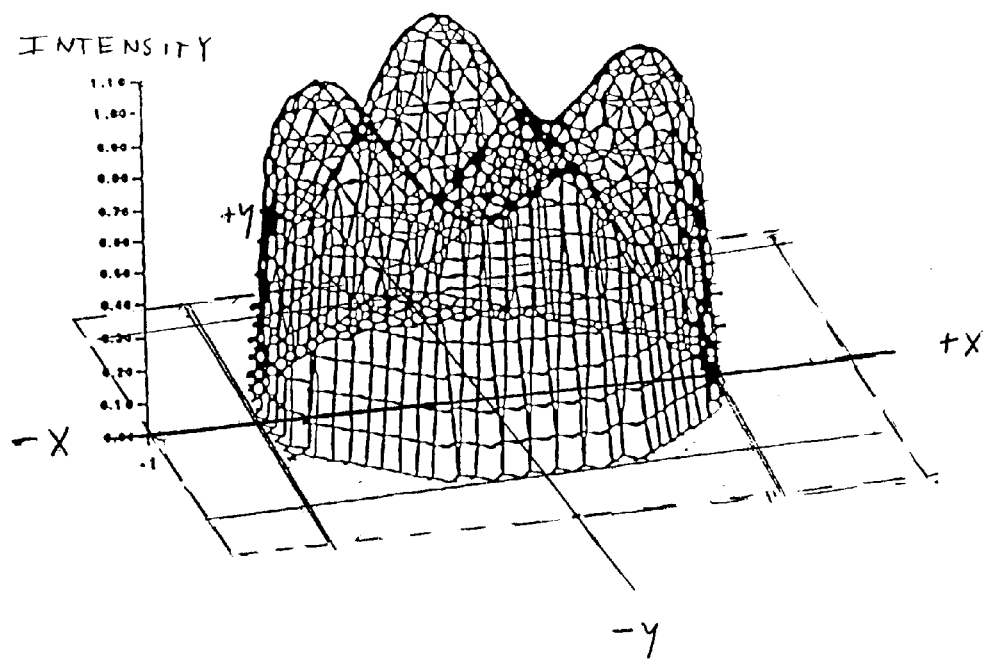
FIG. 16 is a three dimensional plot of the x-y distribution shown in FIG. 15.

The existing intensity distribution at the pupil plane of an illumination system for a projection exposure tool is modified through use of a bi-level masking aperture containing a masking cell representation of the cross-quad intensity distribution. FIGS. 15 and 16 show such distributions where four distributed-intensity zones allow for cross-quad illumination of a photomask that contains geometry oriented in horizontal and vertical directions. If the existing illumination intensity distribution at the pupil plane of the illumination system is not uniform, the non-uniformity at the plane can be deconvolved in accordance with the invention to result in a masking aperture that also incorporates compensation for non-uniformity. For example, many steppers provide a pupil that is guaranteed uniform (+/−1%) for only 80% of its fall opening. At 85% open, the uniformity of illumination may vary up to +/−20% or more. With the invention, the non-uniformity may be canceled or reduced to an acceptable level.

Zones may be circular, elliptical, 45 degree elliptical (that is, elliptical but oriented with axes at angles of 45 degrees and 135 degrees), square, or other shapes dependent on the desired distribution of diffraction information to match mask geometry requirements or specific lens behavior. The distribution of the energy in these zones or rings may be stepped, Gaussian, Lorentzian, or other similar shape. The kurtosis of gaussian distributions may be normal (mesokurtic), narrow (leptokurtic), or flat-topped (platykurtic), for combinations of these among zones. Skewness, or departure from symmetry of the distribution may be utilized for differential weighting of certain feature sizes. Circular symmetry may be best suited for most general cases and elliptical distributions can be utilized to accommodate x-y nonuniformities of the photomask or imparted by the projection lens (a result for instance of astigmatic or comatic aberration).

The invention may be used in other off axis illumination systems including the one shown and described in U.S. Pat. No. 5,926,257. There an illumination optical system includes a first diffraction optical element, a second diffraction optical element and a condenser lens. The first diffraction optical element has a plurality of micro diffraction optical elements, which have a first optical power in a first direction and an optical power different from the first optical power in a second direction, perpendicular to the first direction. The second diffraction optical element has a plurality of micro diffraction optical elements, which have a second optical power in the second direction and an optical power different from the second optical power in the first direction. The first optical power is different from the second optical power. Light supplied from a light source forms a plurality of secondary light sources by passing through the first and second diffraction optical elements. Light from the secondary light sources passing through the condenser lens generates Kohler illumination on a surface to be irradiated. When such an illumination designed for cross-quad intensity distribution is equipped with the chromeless mask having the phase shift boundaries described about, similar beneficial results may be obtained.

Another illumination system that uses modified diffraction optics also works with the chromeless mask of the invention, In U.S. Pat. No. 5,631,721 there is shown a hybrid illumination system for use in photolithography. Its illumination system has an array optical element near the formation of a desired illumination field. Light or electromagnetic radiation from illumination source is expanded and received by a multi-image optical element forming a plurality of secondary illumination sources in a plane. A condenser receives the light from the plurality of illumination sources. An array or a diffractive optical element is placed on or near the focal point of the condenser. The illumination plane formed at the focal point of the condenser is within the near field diffraction pattern of the array or diffractive optical element. There is no condenser following the array or diffractive optical element. The use of the array or the diffractive optical element permits the use of a condenser between the multi-image optical element and the array or the diffractive optical element having a smaller numerical aperture than the emergent numerical aperture of the diffractive optical element, and generates a desired cross-quad angular distribution with little dependence on the illumination source profile.

What we claim is:

1. A method for generating an image on a photosensitive surface of a substrate from a relief pattern on a translucent photomask, said image comprising a line having a width corresponding to space between opposing closely spaced phase shift boundary regions in or on the photomask, said phase shift boundary regions extending along orthogonal first and second directions, said method comprising:

providing a light source having increased intensity portions on first and second orthogonal axes that correspond to the orthogonal orientation of imaged features where first and second increased intensity portions are located on each axis and on opposite sides of the intersection of the axes; and illuminating the relief pattern in or on the substrate with light from the light source.

2. The method of claim 1 further comprising filtering the light source through an aperture mask comprising a plurality of pixels arranged to form one or more regions of variable transmissivity.

3. The method of claim 1 further comprising filtering the light source through an aperture mask having one or more apertures.

4. The method of claim 1 further comprising one or more beam splitters disposed in the path of the light for shaping the light into two or more beams.

5. The method of claim 1 further comprising one or more diffractive optical element approach for shaping the light into two or more beams.

6. The method of claim 1 wherein the relief pattern comprises regions of material thicker than the substrate.

7. The method of claim 1 wherein portions of the substrate are removed to form relief patterns.

8. The method of claim 1 where the distance between the relief patterns is less than the resolution limit of an exposure tool times the reduction ratio of the exposure tool.

9. The method of claim 8 where the distance between the relief patterns is distance in the range of M times 0.2 $\lambda$/NA to M times 0.3 $\lambda$/NA where M is the reduction ratio of the optical system, $\lambda$ is the wave length of incident light and NA is the numerical aperture of the illumination system.

10. A method for imaging a linear feature extending along orthogonal first and second directions, said method comprising:

providing a light source with decreased intensity portions at the center thereof and decreased along orthogonal axes arranged at about 45 degrees between the first and second orthogonal directions;

providing a photomask with phase shift boundary patterns disposed closely spaced from each other for creating a dark region corresponding to the space between the closely spaced phase shift boundary regions.

11. The method of claim 10 further comprising filtering the light source through an aperture mask comprising a plurality of pixels arranged to form one or more regions of variable transmissivity.

12. The method of claim 10 further comprising filtering the light source through an aperture mask having one or more apertures.

13. The method of claim 10 further comprising one or more beam splitters disposed in the path of the light for shaping the light into two or more beams.

14. The method of claim 10 further comprising one or more diffractive optical element approach for shaping the light into two or more beams.

15. The method of claim 10 wherein the relief pattern comprises regions of material thicker than the substrate.

16. The method of claim 10 wherein portions of the substrate are removed to form relief patterns.

17. The method of claim 16 where the distance between the relief patterns is less than the resolution limit of an exposure tool times the reduction ratio of the exposure tool.

18. The method of claim 17 where the distance between the relief patterns is distance in the range of M times 0.2 $\lambda$/NA to M times 0.3 $\lambda$/NA where M is the reduction ratio of the optical system, $\lambda$ is the wave length of incident light and NA is the numerical aperture of the illumination system.

19. An imaging system for producing fine lithographic features oriented along two orthogonal directions, comprising
   an illumination source having four separate localized areas having higher transmittance than portions of said illumination surrounding said areas and being arranged at locations corresponding to the two orientation axes of the lithographic features at a separation distance corresponding to the frequency of the fine pattern detail;
   a phase shifting mask comprising a transparent substrate with a plurality of relief boundaries closely spaced to each other on the transparent substrate, said relief boundaries spaced close enough so that individual relief boundaries are not imaged and a dark region corresponding to the space between closely paced relief boundaries is imaged.

20. The system of claim 19 further comprising filtering the light source through an aperture mask comprising a plurality of pixels arranged to form one or more regions of variable transmissivity.

21. The system of claim 19 further comprising filtering the light source through an aperture mask having one or more apertures.

22. The system of claim 19 further comprising one or more beam splitters disposed in the path of the light for shaping the light into two or more beams.

23. The system of claim 19 further comprising one or more diffractive optical element approach for shaping the light into two or more beams.

24. The system of claim 19 wherein the relief pattern comprises regions of material thicker than the substrate.

25. The system of claim 19 wherein portions of the substrate are removed to form relief patterns.

26. The system of claim 25 where the distance between the relief patterns is less than the resolution limit of an exposure tool times the reduction ratio of the exposure tool.

27. The system of claim 26 where the distance between the relief patterns is distance in the range of M times 0.2 $\lambda$/NA to M times 0.3 $\lambda$/NA where M is the reduction ratio of the optical system, $\lambda$ is the wave length of incident light and NA is the numerical aperture of the illumination system.

28. A projection lithography system for forming finely spaced features on a sensitized surface of a comprising:
   means for generating pairs of illumination regions with each of a first pair disposed on opposite sides of a first axis and each of a second pair disposedon opposite sides of a second axis orthogonal to the first axis; and
   phase shift means disposed on a translucent substrate in the path of illumination from said illumination regions and closely spaced apart a distance to define a relatively dark line corresponding to the space between the phase shift means.

29. The system of claim 28 wherein the means for generating pairs of illumination regions further comprises means for filtering the light source through an aperture mask comprising a plurality of pixels arranged to form one or more regions of variable transmissivity.

30. The system of claim 28 wherein the means for generating pairs of illumination regions further comprises means for filtering the light source through an aperture mask having one or more apertures.

31. The system of claim 28 wherein the means for generating pairs of illumination regions further comprises one or more beam splitters disposed in the path of the light for shaping the light into two or more beams.

32. The system of claim 28 wherein the means for generating pairs of illumination regions further comprises one or more diffractive optical element approach for shaping the light into two or more beams.

33. The system of claim 28 wherein the relief pattern comprises regions of material thicker than the substrate.

34. The system of claim 28 wherein portions of the substrate are removed to form relief patterns.

35. The system of claim 34 where the distance between the relief patterns is less than the resolution limit of an exposure tool times the reduction ratio of the exposure tool.

36. The system of claim 35 where the distance between the relief patterns is distance in the range of M times 0.2 $\lambda$/NA to M times 0.3 $\lambda$/NA where M is the reduction ratio of the optical system, $\lambda$ is the wave length of incident light and NA is the numerical aperture of the illumination system.

37. A projection lithography system comprising:
   a quadrupole illumination system with four poles placed on axial positions for off-axis illumination of X and Y oriented mask geometry for providing off-axis illumination angles in the same manner as a dipole and equivalent diffraction energy distribution results; and
   a phase shift boundary mask comprising two fine phase shift feature boundaries disposed in close proximity to each other for imaging a dark space on a photosensitized surface of a wafer, said dark space corresponding to the region between the phase shift masking boundaries.

38. The system of claim 37 wherein the quadrupole illumination system further comprises means for filtering the light source through an aperture mask comprising a plurality of pixels arranged to form one or more regions of variable transmissivity.

39. The system of claim 37 wherein the quadrupole illumination system further comprises means for filtering the light source through an aperture mask having one or more apertures.

40. The system of claim 37 wherein the quadrupole illumination system further comprises one or more beam splitters disposed in the path of the light for shaping the light into two or more beams.

41. The system of claim 37 wherein the quadrupole illumination system further comprises one or more diffractive optical element approach for shaping the light into two or more beams.

42. The system of claim 37 wherein the phase shift boundary regions comprise regions of material thicker than the substrate.

43. The system of claim 37 wherein portions of the substrate are removed to form the phase shift boundary regions.

44. The system of claim 43 where the distance between the relief patterns is less than the resolution limit of an exposure tool times the reduction ratio of the exposure tool.

45. The system of claim 44 where the distance between the phase shift boundary regions is in the range of M times $0.2 \lambda/NA$ to M times $0.3 \lambda/NA$ where M is the reduction ratio of the optical system, $\lambda$ is the wave length of incident light and NA is the numerical aperture of the illumination system.

46. A boundary phase shift photomask comprising;
   a transparent substrate for receiving radiation at a chosen wave length;
   a relief pattern defined on the transparent substrate and comprising one or more pairs of closely spaced phase shift boundaries wherein the boundaries are parallel to each other and the boundaries are spaced closely adjacent each other in accordance with the chosen wave length of the radiation for forming a relatively dark region in a focal plane corresponding to the space between the closely spaced phase shift boundary regions.

47. The photomask of claim 46 wherein a transparent phase shift layer is disposed on or in the transparent substrate and the relative difference in thickness between the phase shift layer and the substrate is sufficient to destructively interfere with incident radiation.

48. The photomask of claim 46 wherein the phase shift boundary regions comprises regions of material thicker than the substrate.

49. The photomask of claim 46 wherein portions of the substrate are removed to form the phase shift boundary regions.

50. The photomask of claim 49 where the distance between the relief patterns is less than the resolution limit of an exposure tool times the reduction ratio of the exposure tool.

51. The photomask of claim 50 where the distance between the phase shift boundary regions is in the range of M times $0.2 \lambda/NA$ to M times $0.3 \lambda/NA$ where M is the reduction ratio of the optical system, $\lambda$ is the wave length of incident light and NA is the numerical aperture of the illumination system.

* * * * *